(12) United States Patent
Tenca et al.

(10) Patent No.: US 6,960,758 B2
(45) Date of Patent: Nov. 1, 2005

(54) ENCODER SYSTEM AND METHOD OF ASSEMBLING AN ENCODER SYSTEM

(75) Inventors: Vittorio Tenca, Caprino Veronese (IT); Corrado Carradori, Pescantina (IT)

(73) Assignee: PWB-Ruhlatec Industrieprodukte GmbH, Seebach (DE)

( * ) Notice: Subject to any disclaimer, the term of this patent is extended or adjusted under 35 U.S.C. 154(b) by 0 days.

(21) Appl. No.: 10/893,157

(22) Filed: Jul. 15, 2004

(65) Prior Publication Data

US 2005/0057109 A1 Mar. 17, 2005

(30) Foreign Application Priority Data

Jul. 15, 2003 (DE) .......................................... 103 32 167

(51) Int. Cl.[7] ................................................. G01D 5/34
(52) U.S. Cl. ................................. 250/231.13; 310/68 B
(58) Field of Search ...................... 250/231.13, 231.14, 250/239; 310/68 B, 68 R, 66, 89, 42

(56) References Cited

U.S. PATENT DOCUMENTS

| | | |
|---|---|---|
| 4,034,612 A | 7/1977 | Buckwitz |
| 4,206,456 A | 6/1980 | Malinowski et al. |
| 4,355,403 A | 10/1982 | Spaniol et al. |
| 4,424,413 A | 1/1984 | Skobranek |
| 4,654,575 A | 3/1987 | Castleman |
| 4,656,743 A | 4/1987 | Thiemann et al. |
| 4,675,661 A | 6/1987 | Ishii |
| 4,709,320 A | 11/1987 | Konopka |
| 4,753,112 A | 6/1988 | Wetterhorn et al. |
| 4,942,295 A | 7/1990 | Brunner et al. |
| 5,057,684 A | 10/1991 | Service |
| 5,066,857 A | 11/1991 | Ernst |
| 5,081,756 A | 1/1992 | Abe et al. |
| 5,155,401 A | 10/1992 | Kanaya et al. |
| 5,184,038 A | 2/1993 | Matsui et al. |
| 5,594,333 A | 1/1997 | Whipple, III |
| 5,646,523 A | 7/1997 | Kaiser et al. |
| 5,708,496 A | 1/1998 | Barnett et al. |
| 5,859,425 A | 1/1999 | Mleinek et al. |
| 5,883,384 A | 3/1999 | Kato et al. |

(Continued)

FOREIGN PATENT DOCUMENTS

| | | |
|---|---|---|
| DE | 32 32 258 A1 | 5/1983 |
| DE | 198 55 064 A1 | 5/2000 |
| EP | 0 557 564 A1 | 9/1993 |
| JP | 47-20729 A1 | 7/1972 |
| JP | 63-228024 A1 | 9/1988 |
| WO | WO-96/14798 A1 | 5/1996 |

OTHER PUBLICATIONS

"Motor Encoder", IBM Technical Disclosure Bulletin, Aug. 30, 1987, vol. 3, No. 3, pp. 968–971.
Patent Abstracts of Japan, Publication No. 03–009470, "Operation Mode Switching Control Device for Automatic Machine", Jan. 17, 1991, Omron Corp.
Patent Abstracts of Japan, Publication No. 03–107348, "Low–Noise Cooling Fan for Variable–Speed Machine", May 7, 1991, Ford Motor Co.

(Continued)

*Primary Examiner*—David Porta
*Assistant Examiner*—Seung C. Sohn
(74) *Attorney, Agent, or Firm*—Darby & Darby

(57) ABSTRACT

An encoder system with a timing disc includes a preassembled circuit board with a U-shaped sensor/emitter embracing the edge of the timing disc. The timing disc is configured to be slipped onto a motor shaft at the flange end of an electric motor, and the circuit board is designed to be mounted on the flange of the motor by mechanical, thermal, and/or adhesive means of attachment. The motor flange is equipped with a centering collar that has a flattened portion on its otherwise circular circumference. The circuit board has a cutout opening that receives the centering collar in a form-fitting way when the circuit board is slid onto the flange of the motor. By rotating the circuit board 90° about the centering collar, the circuit board is secured in a defined position on the motor flange.

10 Claims, 3 Drawing Sheets

U.S. PATENT DOCUMENTS

| | | | |
|---|---|---|---|
| 6,175,196 B1 | 1/2001 | Ragner et al. | |
| 6,298,565 B1 | 10/2001 | Weber et al. | |
| 6,316,930 B1 | 11/2001 | Camin | |
| 6,414,450 B1 | 7/2002 | De Wulf | |
| 6,462,442 B1 * | 10/2002 | Braun et al. | 310/68 B |

OTHER PUBLICATIONS

Patent Abstracts of Japan, Publication No. 62–092162, "Spindle Motor Mechanism for Disc Device", Apr. 27, 1987, Hitachi Ltd.

Abstract, German Patent No. DE19836666, Feb. 17, 2000, Kostal Leopold GmbH & Co. KG.

Abstract, German Patent No. DE4022837, Jan. 23, 1992, Morche Dirk W Dipl. Ing.

Abstract, German Patent No. DE3803853, Aug. 17, 1989, Zeiss Carl FA.

Abstract, German Patent No. DE19838731, Mar. 9, 2000, Kostal Leopold GmbH & Co. KG.

Abstract, German Patent No. DE19601965, Jan. 20, 1996, ITT Manufacturing Enterprises, Inc.

Abstract, German Patent No. DE3408437, Mar. 8, 1984, Thiemann.

Abstract, German Patent No. DE4409892, May 23, 1994, Kaiser.

Abstract, German Patent No. DE3926799, Aug. 14, 1989, Johannes Heidenheim GmbH.

* cited by examiner

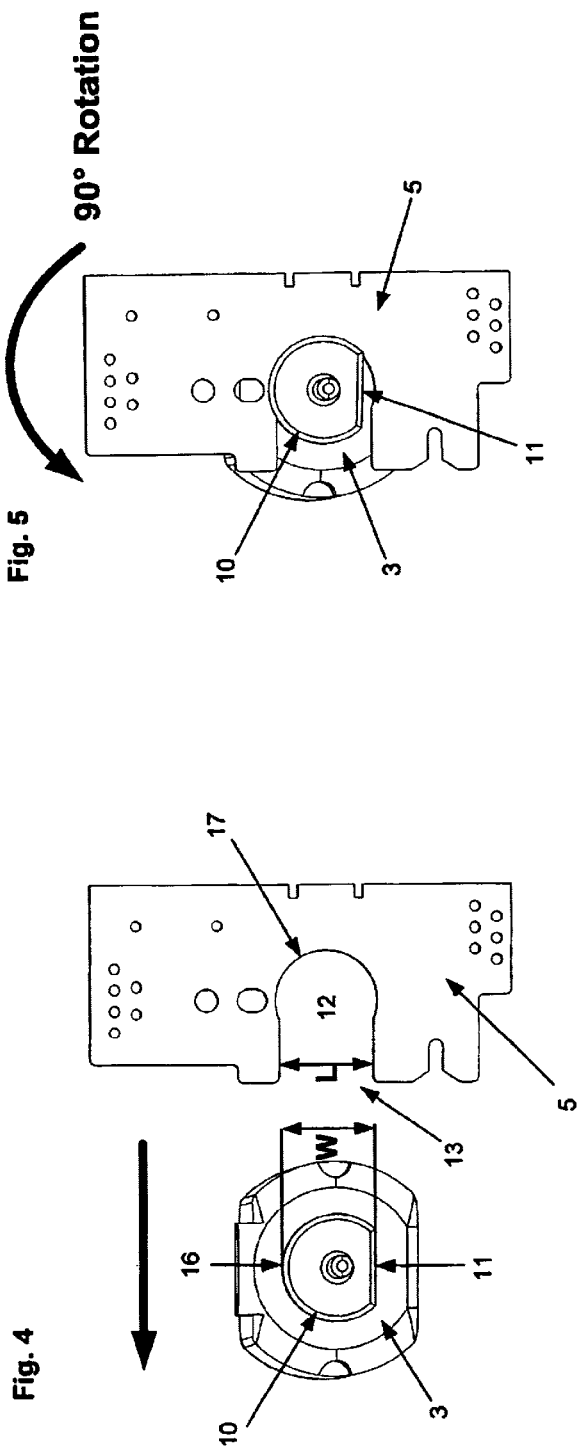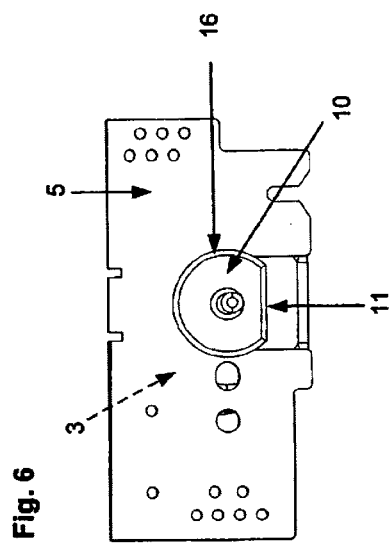

ENCODER SYSTEM AND METHOD OF ASSEMBLING AN ENCODER SYSTEM

BACKGROUND OF THE INVENTION

The invention relates to an encoder system with a plurality of elements forming an assembly that can be fastened to the flange end of an electric motor by mechanical, thermal, and/or adhesive means of attachment. The encoder system includes a timing disc, a circuit board, and a plug-in connector. The timing disc can be slipped onto a motor shaft at the flange end of an electric motor. The motor can be connected to a power source by means of contact elements. The circuit board has connections for a U-shaped sensor-emitter unit which embraces the edge of the timing disc and is adjustable in all three spatial directions to permit the reception of position signals. The plug-in connector has connecting leads forming electrically conductive connections between the elements forming the assembly.

The invention further relates to a method of installing an encoder system of a design that meets the foregoing description.

Encoder systems of the type described above have to meet stringent requirements regarding accuracy under the most varied environmental conditions. They need to be designed for mass production, i.e., with the smallest possible number of simple and fail-safe components. Adjustment has to be highly accurate under all environmental conditions, even in complicated installation situations.

Because of the narrow and restricted installation space, the currently used encoder systems are predominantly equipped with a U-shaped sensor-emitter unit. The U-shaped sensor-emitter unit can easily be combined with the remaining elements to form an assembly, where the connectors of the sensor-emitter unit are inserted into a circuit board and connected to contact terminals for the supply of power and other connections.

In an automated assembly process of the encoder system, the problem presents itself that feed advance movements have to be carried out along several axes, where the need for a high degree of precision imposes special requirements on assembly devices, feed advance movements, and guide elements for the moving parts of the assembly machine. Encoder systems are therefore expensive, and the prior art production methods are failure prone.

OBJECT OF THE INVENTION

It is therefore the object of the present invention to develop an encoder system as well as a method of assembling an encoder system, wherein the processes of centering the timing disc on the motor shaft and positioning the sensor-emitter unit can be performed in one operating step, and wherein the tools and assembly devices can be controlled in the simplest possible way and therefore with a high degree of accuracy.

SUMMARY OF THE INVENTION

In accordance with the invention, the objective is achieved by an encoder system with a plurality of elements forming an assembly that can be fastened to the flange end of an electric motor by mechanical, thermal, and/or adhesive means of attachment. The encoder system includes a timing disc and a circuit board with a sensor-emitter unit and a plug-in connector. The timing disc can be slipped onto a motor shaft at the flange end of an electric motor. The motor can be connected to a power source by means of contact elements. The circuit board has connections for the U-shaped sensor-emitter unit which embraces the edge of the timing disc and is adjustable in all three spatial directions to permit the reception of position signals. The plug-in connector has connecting leads forming electrically conductive connections between the elements forming the assembly. The flange end of the electric motor which faces the timing disc is equipped with a centering collar which, in a plan view, is approximately circular but has a flattened portion on at least one side. The flattened portion together with the opposed edge of the circular centering collar, presents an insertion width (W) that is reduced relative to the circle diameter of the centering collar. As a further feature of the inventive encoder, the circuit board has a recess which receives the circular centering collar in a form-fitting way and where the centering collar can be securely fixed in place. The recess is open towards a side of the circuit board, with the width L of the opening corresponding to the reduced insertion width (W) of the centering collar.

The centering collar in preferred embodiments of the inventive encoder has a height H (measured in the axial direction of the motor shaft) that exceeds the thickness S of the circuit board.

It has been found advantageous to use materials of different hardness for the circuit board and for the centering collar. Preferably, the circuit board is made of a glass-fiber-reinforced plastic material, while the centering collar is made of polyvinyl chloride, polyurethane, or polyethylene.

In preferred embodiments of the invention, a groove which runs at least partially around the circumference of the centering collar is formed in the edge surface of height (H) of the centering collar. Preferably, this groove is formed by a cutting edge provided at the circuit board.

As a further feature of preferred embodiments of the invention, the connection between the circuit board and the centering collar is reinforced by a mechanical clamping device, an adhesive bond, a friction bond, or a weld seam.

A method of installing the inventive encoder system includes the following steps:

A. The timing disc is slipped onto the motor shaft of the electric motor which has a centering collar with at least one flattened portion.
B. The circuit board, which has been pre-assembled with the elements described above and which has a recess that is open towards the edge of the circuit board, is slid laterally into the flange plane of the electric motor in a direction where the centering collar presents a narrower diameter due to the flattened portion, whereby the circuit board is brought into an adjusting position.
C. The circuit board is rotated to secure it in place.

Preferably, the step of securing the circuit board in place is performed through a rotation of 90°.

It is advantageous, prior to sliding the circuit board on the centering collar, to apply an adhesive to the recess of the circuit board and to allow the adhesive bond to harden after the inserting and rotating steps.

It has been found that as a result of the inventive design of the new encoder system, easy centering of the timing disc and of the circuit board can be achieved with only two feed advance movements of the assembly system. The two movements can be carried out independently of one another, so that there is no need to move into any intermediate positions. Installation can take place with largely preassembled elements in a single operation, thus achieving large production runs of 1000 parts per hour on one production unit.

BRIEF DESCRIPTION OF THE DRAWINGS

The invention will be explained below in greater detail with reference to several exemplary embodiments illustrated in the attached drawings, wherein:

FIGS. 4, 5 and 6 illustrate the sequence of steps for sliding the circuit board onto the centering collar and securing the circuit board through a 90° rotation.

DETAILED DESCRIPTION OF PREFERRED EMBODIMENTS

Figure 1:
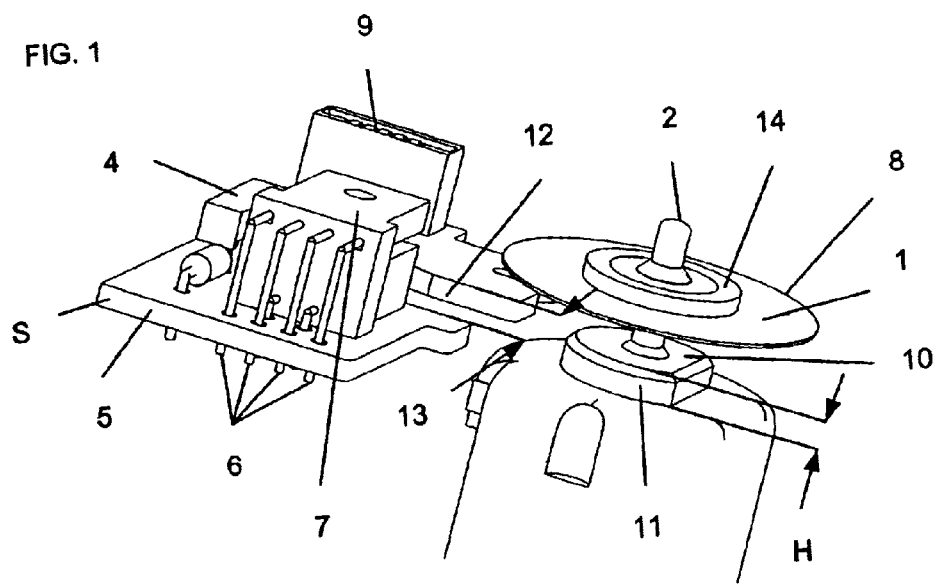
FIG. 1 represents an exploded view of all elements prior to installation.

FIG. 1 shows an encoder system according to the invention. The timing disc 1 has a timing disc hub 14 for centering purposes and is designed so that it can be mounted on a motor shaft 2. The circuit board 5 has a sensor-emitter unit 7 and a plug-in connector 9.

The motor shaft 2 forms part of an electric motor 3. At the upward end of the motor 3, in the flange plane where the motor shaft 2 protrudes through an opening, the motor flange has a centering collar 10 with a flattened portion 11. The shape of the centering collar 10 is designed to permit centering of the motor 3 in the flange plane with reference to the sensor-emitter unit 7 and the timing disc 1. The circuit board 5 has an opening 13 so that the circuit board can be slid over the centering collar into a position where the centering collar is seated in a correspondingly shaped recess 12.

The circuit board 5 carries all the connections required for the supply of power to the connecting leads 6 of the sensor-emitter unit 7 and to the connecting leads 18 of the plug-in connector 9. The circuit board with these components can easily be preassembled and put in an intermediate storage before the final assembly.

Figure 2:
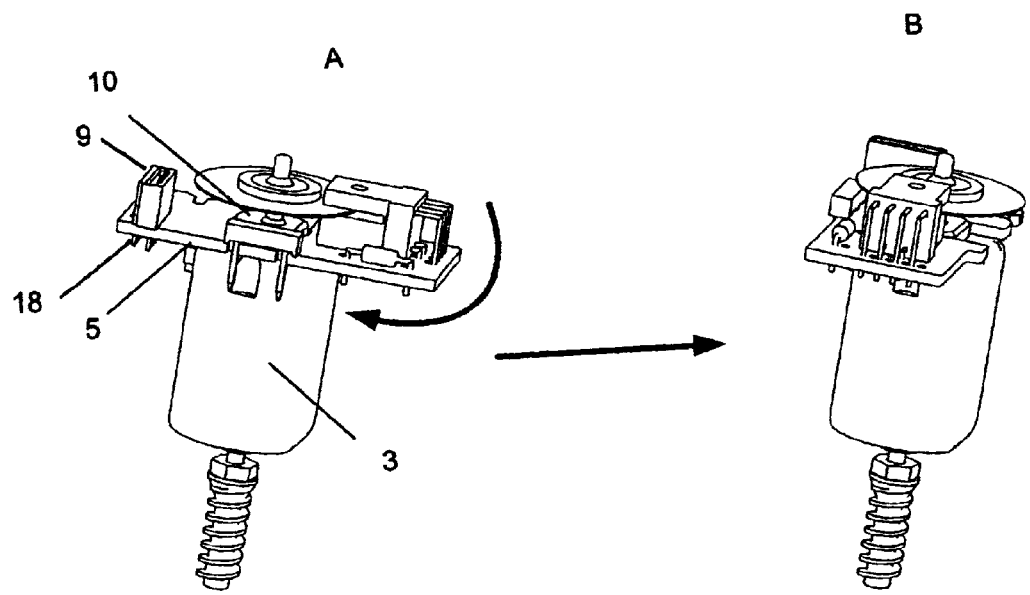
FIGS. 2A and 2B represent a perspective view of the installation of the inventive encoder system.

The new encoder system in its finished and installed state is shown in FIG. 2. To achieve this end condition, the timing disc 1, by means of the timing disc hub 14, is set onto the motor shaft 2 and pushed in the axial direction into the required position.

The foregoing assembly step is simple and is already being carried out with existing tools and devices, achieving large production numbers.

The circuit board 5 is installed perpendicularly to the axial direction in a plane that is referred to as flange plane and is either identical or parallel to the plane of the end surface of the electric motor 3, containing the main plane of the substantially circular centering collar 10. The intermediate and final stages of installation are illustrated in FIG. 2.

After the circuit board 5 has been slid onto the centering collar 10 (FIG. 2A), it is rotated in the flange plane by 90°, as a result of which the circuit board is seated in its final position on the centering collar 10 (FIG. 2B). The connection can be secured in different ways, for example through a form-fitting and/or force-locking attachment, by adhesive bonding, a thermal connection, a mechanical connection or by a combination of connecting methods.

Figure 3:
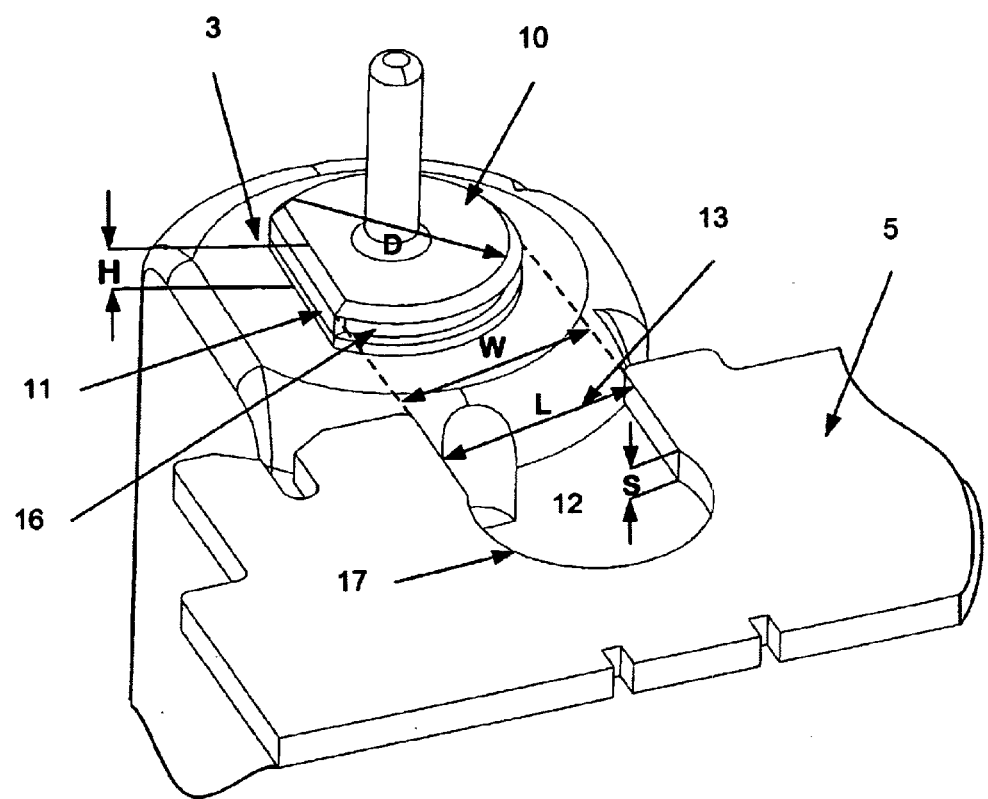
FIG. 3 shows an enlarged view in the plane of the circuit board portion receiving the centering collar.

FIG. 3 illustrates the step of the installation movement of the circuit board in the flange plane. It shows the portion of the part of the circuit board 5 that contains the recess 12 which, by way of a lateral opening 13, can be slipped onto the centering collar 10. For this purpose, an insertion width W between the flattened circumference portion 11 of the centering collar 10 and the opposed edge is designed narrow enough to slip through the lateral opening 13 of the circuit board 5. After the circuit board has been slid in place so that the centering collar is seated in the recess 12, the circuit board 5 is rotated relative to the centering collar 10 by approximately 90°. As a result, the two parts now have a form-locking connection which, at the same time, can be used as a reference for positioning the elements of the encoder system.

In the illustrated example, the recess 12 with the opening 13 is contoured in the shape of the Greek letter $\Omega$. However, other shape combinations between the recess 12 and the centering collar 10 are also conceivable, for example, heart-shaped or even triangular-shaped.

Furthermore, fixating the parts in their relative positions to each other can be improved by various methods, for example by combining soft and hard materials, in which case, after the parts have been united by sliding and rotating relative to one another, a force-locking connection is achieved with a stress-biased contact or forced engagement between the parts.

In a further example of a form-fitting connection, the circumference of the centering collar 10 has at least along certain portions a groove that is engaged by the edge of the circuit board recess 12. To further strengthen the form-fitting connection, the circuit board is preferably produced from a hard material such as a glass-fiber-reinforced plastic material, with a thickness that is slightly less than the height of the centering collar 10 or the width of the aforementioned groove.

In a further embodiment of the invention, the perimeter of the recess 12 is configured as a cutting edge, so that the circuit board 5, when being slid onto the centering collar and rotated, produces an indentation in the centering collar 10. In this simple way, it is possible to achieve a firm and permanent fixation between the circuit board and the motor.

FIG. 4 illustrates the circuit board oriented for installation on the motor 3, where the centering collar 10 with the flattened portion 11 presents a reduced insertion width W.

When the circuit board 5 is slid in the direction of the arrow onto the flattened portion 11, the sides of the opening 13 of the recess 12 come first into contact with the groove 16.

FIG. 5 shows the circuit board 5 after it has been slid fully into the flange plane of the motor 3. To allow the opening 13 to slide over the centering collar 12, the width "L" of the opening 13 is larger than the insertion width "W" of the centering collar 10.

After the centering collar 10 has been received in the recess 12, the parts are rotated relative to each other by approximately 90° as indicated by the arrow in FIG. 5.

FIG. 6 shows the circuit board in the installed condition where the edge of the circuit board 5 (which can be configured as a cutting edge 17) is in form-fitting engagement with the groove 16 of the centering collar 10.

What is claimed is:

1. An encoder system comprising a timing disc and a circuit board with a U-shaped sensor/emitter unit and a plug-in connector, wherein:

the circuit board with circuit components including the sensor/emitter unit and U-shaped connector is configured as an assembly unit that can be fastened to a flange end of an electric motor by at least one of a mechanical, thermal, and adhesive means of attachment;

the timing disc is configured to be slipped onto a motor shaft at the flange end of the electric motor;

the motor is configured for connection to a power source by means of contact elements;

the circuit board has connections for the U-shaped sensor-emitter unit;

the sensor-emitter unit is operable to receive position signals, embraces an edge portion of the timing disc, and is adjustable in all three spatial directions;

the plug-in connector has connecting leads forming electrically conductive connections to said circuit components;

said flange end of the electric motor faces the timing disc and is equipped with a centering collar which, in a plan view, is approximately circular but has a flattened portion on at least one side, said flattened portion together with an opposed edge of the centering collar presenting an insertion width (W) that is reduced relative to a circle diameter of the centering collar;

the circuit board has a recess which receives the centering collar in a form-fitting way allowing the centering collar to be fixated in a defined position; and the recess is open towards a side of the circuit board, with a width (L) of the opening corresponding to said reduced insertion width (W) of the centering collar.

2. The encoder system of claim 1, wherein the centering collar has a lateral height (H) which is measured in an axial direction of the motor shaft and which is greater than a thickness (S) of the circuit board.

3. The encoder system of claim 1, wherein the circuit board and the centering collar are made of materials of different hardness.

4. The encoder system of claim 3, wherein the circuit board is made of a glass-fiber-reinforced plastic material, while the centering collar is made of a material from the group that consists of polyvinyl chloride, polyurethane, and polyethylene.

5. The encoder system of claim 1, wherein a groove which runs at least partially around the centering collar is formed in a circumferential edge surface having the height (H) of the centering collar.

6. The encoder system of claim 5, wherein the groove is formed by a cutting edge provided at the circuit board.

7. The encoder system of claim 1, wherein a positional fixation of the circuit board on the centering collar is reinforced by one of a mechanical clamping device, an adhesive bond, a friction bond, and a welded bond.

8. A method of installing an encoder system on an electric motor, said encoder system comprising a timing disc and a circuit board with a U-shaped sensor/emitter unit and a plug-in connector, wherein:

the circuit board with circuit components including the sensor/emitter unit and U-shaped connector is configured as an assembly unit that can be fastened to a flange end of an electric motor by at least one of a mechanical, thermal, and adhesive means of attachment;

the motor is configured for connection to a power source by means of contact elements;

the circuit board has connections for the U-shaped sensor-emitter unit;

the sensor-emitter unit is operable to receive position signals, embraces an edge portion of the timing disc, and is adjustable in all three spatial directions;

the plug-in connector has connecting leads forming electrically conductive connections to said circuit components;

said flange end of the electric motor faces the timing disc and is equipped with a centering collar which, in a plan view, is approximately circular but has a flattened portion on at least one side, said flattened portion together with an opposed edge of the circular centering collar presenting an insertion width (W) that is reduced relative to a circle diameter of the centering collar;

the circuit board has a recess which receives the circular centering collar in a form-fitting way allowing the centering collar to be fixated in a defined position; and the recess is open towards a side of the circuit board, with a width (L) of the opening corresponding to said reduced insertion width (W) of the centering collar;

the method comprising the steps of:

A. slipping the timing disc onto the motor shaft;

B. sliding the circuit board, which has been pre-assembled with said circuit elements, into a flange plane of the electric motor from a direction where the centering collar presents said reduced insertion width, thereby bringing the circuit board into an adjusting position, and C. rotating the circuit board to secure it in place.

9. The method of claim 8, wherein step C comprises rotating the circuit board by an angle of 90°.

10. The method of claim 8, wherein prior to step B, an adhesive is applied to the recess of the circuit board and after step C, the adhesive is allowed to harden.

* * * * *